United States Patent
Rabiei et al.

(10) Patent No.: US 10,663,661 B1
(45) Date of Patent: May 26, 2020

(54) APPARATUS FOR BONDING WAFERS AND AN OPTICALLY-TRANSPARENT THIN FILM MADE FROM THE SAME

(71) Applicant: Partow Technologies LLC, Vista, CA (US)

(72) Inventors: Payam Rabiei, Vista, CA (US); Jamie Nam, Vista, CA (US); Amir Torkaman, Vista, CA (US); Seyfollah Toroghi, Vista, CA (US)

(73) Assignee: Partow Technologies, LLC., Vista, CA (US)

( * ) Notice: Subject to any disclaimer, the term of this patent is extended or adjusted under 35 U.S.C. 154(b) by 0 days.

(21) Appl. No.: 16/258,546

(22) Filed: Jan. 26, 2019

Related U.S. Application Data (60) Provisional application No. 62/622,785, filed on Jan. 26, 2018.

(51) Int. Cl.
| | |
|---|---|
| *G02B 6/10* | (2006.01) |
| *G02B 6/122* | (2006.01) |
| *G02B 6/12* | (2006.01) |
| *G02B 6/02* | (2006.01) |
| *G02B 6/13* | (2006.01) |

(52) U.S. Cl.
CPC ......... *G02B 6/122* (2013.01); *G02B 6/02295* (2013.01); *G02B 6/12007* (2013.01); *G02B 6/13* (2013.01); *G02B 2006/1204* (2013.01); *G02B 2006/1218* (2013.01); *G02B 2006/12045* (2013.01); *G02B 2006/12169* (2013.01)

(58) Field of Classification Search
CPC ............... G02B 6/122; G02B 6/02295; G02B 6/12007; G02B 6/13; G02B 2006/12169; G02B 2006/1218; G02B 2006/12045; G02B 2006/1204

See application file for complete search history.

(56) References Cited

U.S. PATENT DOCUMENTS

| | | | | |
|---|---|---|---|---|
| 5,278,716 A | * | 1/1994 | Okuda | G11B 5/235 360/125.01 |
| 2017/0031091 A1 | * | 2/2017 | Yin | C03C 13/048 |

OTHER PUBLICATIONS

T. Shimatsu, M Uomoto, "Atomic diffusion bonding of wafers", J. Vac. Sci. Tehnol. B 28(4), 2010, pp. 706-714, Japan.
E. Higurashi, T Suga, "Review of Low-Temperature Bonding Technologies and Their Application in Optoelectronic Devices", Electronic and Communications in Japan, 2016, vol. 99, No. 3, pp. 63-71, Japan.

* cited by examiner

*Primary Examiner* — Ellen E Kim
(74) *Attorney, Agent, or Firm* — Invent Capture, LLC.; Samuel S. Cho (57) ABSTRACT

A novel apparatus for bonding of two polished substrates includes a plasma source in a ultra-high vacuum (UHV) chamber and a wafer-guiding element to control and guide wafers in the UHV chamber, where after a plasma activation process the wafers are guided and pressed against each other to form a covalent bond between wafer surfaces. The plasma activation process involves deposition of mono-layer or sub-monolayer metallic atom on the surface of substrates. After deposition of metallic layers, a high-force actuation presses the wafers and forms a covalent bond between the wafers. Then, the bonded wafer pair is ion-sliced or thinned to form single crystalline optical thin film. An annealing process oxidizes the deposited metallic layers and produces optically-transparent single crystalline thin film. An optical waveguide may be fabricated by this thin film while utilizing an electro-optic effect to produce optical modulators and other photonic devices.

7 Claims, 13 Drawing Sheets

APPARATUS FOR BONDING WAFERS AND AN OPTICALLY-TRANSPARENT THIN FILM MADE FROM THE SAME

FIELD OF THE INVENTION

The present invention generally relates to an apparatus for bonding two polished surfaces. The present invention is also related to production of functional thin-film substrates from single crystalline or amorphous materials for optical waveguide applications, opto-electronic devices, acoustic devices, RF devices, and other electronic and opto-electronic devices by utilizing the apparatus. More specifically, the apparatus relates to production of thin film substrates of single crystalline piezo-electric, electro-optic, semiconductor, or scintillator crystals. Furthermore, the apparatus also relates to production of thin film substrates of lithium niobate, lithium tantalate, and similar electro-optic crystals. Moreover, the apparatus also relates to a bonding method to produce such thin film crystal substrates. In addition, the apparatus may also be utilized for bonding of these crystals or other crystals to other substrates, such as silicon, germanium, quartz, GaAs, InP, GaN, and other semiconductor or optical materials. Furthermore, the apparatus also relates to bonding for wafer-level packaging of electronic, photonic, and MEMS devices.

BACKGROUND OF THE INVENTION

In various modern electronic or photonic applications, single-crystalline thin film materials are widely utilized in order to enable manufacturing of functional electronic or photonic devices. For example, thin films of electro-optic materials are needed to make optical modulators, electro-optic devices, acousto-optic devices, and nonlinear optical devices. Bonded thin film of semiconductors are particularly useful for fabrication of high-speed or high-power electronic devices. Furthermore, high resolution x-ray detectors often require bonded thin films of scintillator crystals. A wafer-bonding step is necessary to make the thin film layer, which is particularly useful in manufacturing of various high-speed, high-power, x-ray, and/or photonic devices.

Several conventional methods exist for semiconductor and dielectric substrates wafer bonding involving direct or indirect bonding. In indirect wafer bonding techniques, an intermediate layer, such as a glue or some adhesive, is used to attach two wafers. On the other hand, in direct wafer bonding techniques, no adhesive or intermediate layer is needed. For many electronic and photonic applications, indirect wafer bonding methods are not desirable due to high-temperature processing steps during fabrication of devices that are not compatible with adhesive bonding. Furthermore, adhesive bonding methods are not reliable and may not be transparent to optical wavelengths, thus making the conventional indirect wafer bonding techniques generally undesirable for optoelectronics manufacturing.

Direct wafer bonding does not have an adhesive or intermediate layer between the wafers. The direct wafer bonding techniques can be divided to high temperature, low temperature, or room temperature methods. In high temperature methods, wafers need to be heated to a high temperature to achieve wafer bonding. This method works for bonding similar materials or materials that have exact same coefficient of thermal expansion (CTE). If the materials have different CTE the bonding will cause significant stress in the substrates and is not practical to use this method for bonding dissimilar materials. Similarly, low temperature wafer bonding is not appropriate for bonding of materials with different CTE.

In recent years, room temperature wafer direct bonding has been introduced for industrial applications. This new method uses an ultra-high vacuum (UHV) environment. In general, there are two methods for room temperature wafer bonding. Surface Activated Bonding (SAB) and Atomic Diffusion Bonding (ADB) are two methods that have been developed to achieve wafer bonding process (T. Shimatsu, M Uomoto, "Atomic diffusion bonding of wafers", J. Vac. Sci. Tehnol. B 28(4), pp 706-714, 2010, E. Higurashi, T Suga, "Review of Low-Temperature Bonding Technologies and Their Application in Optoelectronic Devices", Electronic and Communications in Japan, Vol. 99, No 3, pp 63-71, 2016).

In SAB, the surface of the wafers is plasma-treated in a UHV chamber where the native oxide layer on a surface is removed and dangling bonds are formed on the surface. These dangling bonds then allow wafer bonding to be formed in the UHV chamber to achieve bonded substrates. The activated surfaces are brought into contact in UHV chamber where the dangling bond can form a covalent bond between two substrates. The covalent bond is very strong. Hence the bond strength for these bonded substrates is very strong. The SAB method is more useful for bonding of metals or semiconductors.

For lithium niobate or other single-crystalline oxide materials, the SAB method may not work well because no dangling bond can be formed on the surface by the plasma treatment when the material for targeted bonding is an oxide material. For bonding of single-crystalline oxide materials, ADB method is employed in which a mono-layer of metals is deposited on the surface of the crystal in UHV chamber. This monolayer metal need to be deposited in a UHV chamber in order to prevent oxidation of the metal. The metal creates dangling bonds on the wafer surface where the dangling bonds can interact and form a covalent wafer bonding similar to the covalent bonding formed by the SAB method.

The ADB might be compared to an adhesive-based bonding method where the mono-layer metallic layer is the adhesive between the two substrates. However, the thickness of the deposited metal layer is a mono-layer or a sub-monolayer. The small amount of deposited material can easily be oxidized or diffused into the substrate, and hence it will not act as a metallic layer. Because the thickness of this layer is very thin and is often less than a mono layer, it will not interfere with electronic or photonic properties of devices fabricated on such substrates. Because the amount of deposited material is a sub-monolayer, it has insignificant or no effect on device performance. Therefore, the ADB method can also be classified as a direct bonding method.

For optical waveguide and opto-electronic device fabrication and manufacturing, a wafer bonding is needed between optical single-crystalline materials and a substrate. The SAB method does not work well in this case because the dangling bond does not exist in an oxide material. The ADB method is generally more suitable for manufacturing applications that require bonding of single crystalline oxides. A thin layer of oxide material will then be formed after bonding a single-crystalline material to a second substrate using crystal ion slicing or thinning. The mono-layer or the sub-mono layer metal layer deposited during bonding may still cause problems because a mono-layer material can still absorb light, which is not desirable in an optical waveguide or opto-electronic device applications. However, an annealing step can be used to agitate the mono-layer metal to be oxidized and diffused into the single-crystalline material, which ensures that a free electron absorption caused by metallic state is eliminated and a bonded thin-film layer is transparent to optical signals.

It may be desirable to devise a novel apparatus and a corresponding manufacturing process to accommodate wafer-bonding steps and fabricate thin films of various electronic or photonic materials. In particular, it may be desirable to devise a novel polished surface-bonding apparatus that provides bonding of two different single-crystalline or amorphous materials at room temperature using ADB or SAB methods. Furthermore, it may also be desirable to devise the polished surface-bonding apparatus to utilize uniquely-structured hinges to place wafers inside an ultra-high vacuum (UHV) environment and a plasma source for achieving surface activation.

In addition, it may also be desirable to devise a novel polished surface-bonding apparatus that exhibits a streamlined and low cost wafer-bonding procedure with a high bonding throughput. Moreover, it may also be desirable to devise a novel device manufacturing method to produce low-loss optical waveguide devices with high productivity by utilizing ADB and annealing techniques.

SUMMARY

Summary and Abstract summarize some aspects of the present invention. Simplifications or omissions may have been made to avoid obscuring the purpose of the Summary or the Abstract. These simplifications or omissions are not intended to limit the scope of the present invention.

In one embodiment of the invention, a novel mechanical apparatus is introduced for manipulation and bonding of the wafers in a UHV environment. The novel apparatus comprises a plasma deposition source, a hinge element where the wafers are placed on the hinge element to be processed in the UHV chamber, and a high-force actuation element to achieve wafer bonding. The hinge element controls or guides the wafers in three positions: loading-unloading, pre-deposition, deposition, and bonding. The plasma deposition source deposits a mono layer of materials on wafer surfaces, or removes a native oxide layer on the wafer surfaces during pre-deposition and deposition process steps. A high-force actuation element is then used to press the wafers inside the ultra-high vacuum chamber to achieve wafer bonding.

In another embodiment of the invention, a method for producing a thin optically transparent layer or a slab optical waveguide is disclosed. This method comprises the steps of: bonding a single-crystalline material to a cladding material using the apparatus discussed above to achieve atomic diffusion bonding; thinning or crystal ion-slicing the single crystalline material to several hundred nanometers or several microns; annealing a bonded and thinned single-crystalline substrate at high temperatures to diffuse a bonding monolayer metal layer and achieve low-loss optical thin film layers that can be used for waveguide or other opto-electronic applications.

Yet in another embodiment of the invention, the novel bonding apparatus disclosed herein may be used for a variety of other electronic applications. For example, for acousto-optic devices, a transducer is typically bonded to generate acoustic waves in an acousto-optic crystal. A piezo-electric material, such as lithium niobate or lithium tantalate, is usually bonded to acousto-optic materials, such as germanium or tellurium oxide. The acoustic wave may be absorbed if an intermediate layer exists between the piezo-electric material and the acousto-optic medium. Preferably, ADB is utilized to directly bond the transducer to the acousto-optic crystal.

Yet in another embodiment of the invention, the novel bonding apparatus is utilized in high-power electronics that generate high amounts of heat, wherein the bonding of highly thermally-conductive materials is desirable for efficient heat dissipation. For example, the novel bonding apparatus is advantageous in manufacturing of high-power electronic devices, such as a power amplifier, where a highly thermally-conductive substrate is bonded to the power amplifier to achieve heat dissipation. SAB or ADB bonding methods may be utilized to bond highly-thermally conductive materials to an integrated circuit or another electronic component-holding substrate and remove heat from a high-power electronic device. Furthermore, other electronic or photonic applications involving thermal management, x-ray detectors, or other photo-electronic applications that require bonding of polished surfaces may utilize the novel bonding apparatus, in accordance with an embodiment of the invention.

DETAILED DESCRIPTION

Specific embodiments of the invention will now be described in detail with reference to the accompanying figures. Like elements in the various figures are denoted by like reference numerals for consistency.

In the following detailed description of embodiments of the invention, numerous specific details are set forth in order to provide a more thorough understanding of the invention. However, it will be apparent to one of ordinary skill in the art that the invention may be practiced without these specific details. In other instances, well-known features have not been described in detail to avoid unnecessarily complicating the description.

The detailed description is presented largely in terms of procedures, logic blocks, processing, and/or other symbolic representations that directly or indirectly resemble a wafer bonding tool, a method of bonding semiconductor, dielectric, or metallic surfaces, and/or a method of low-loss dielectric optical waveguide fabrication or other opto-electronic device applications as described in various embodiments of the invention. These process descriptions and representations are the means used by those experienced or skilled in the art to most effectively convey the substance of their work to others skilled in the art.

Reference herein to "one embodiment" or "an embodiment" means that a particular feature, structure, or characteristic described in connection with the embodiment can be included in at least one embodiment of the invention. The appearances of the phrase "in one embodiment" in various places in the specification are not necessarily all referring to the same embodiment. Furthermore, separate or alternative embodiments are not necessarily mutually exclusive of other embodiments. Moreover, the order of blocks in process flowcharts or diagrams representing one or more embodiments of the invention do not inherently indicate any particular order nor imply any limitations in the invention.

For the purpose of describing the invention, a term "wafer bonding" is generally defined as a processing method, in which two material surfaces are brought into contact and a covalent chemical bond is achieved between atoms on a surface of a first material and atoms on a surface of a second material.

In one embodiment of the invention, a novel apparatus is disclosed for bonding of polished surfaces.

Figure 1A:
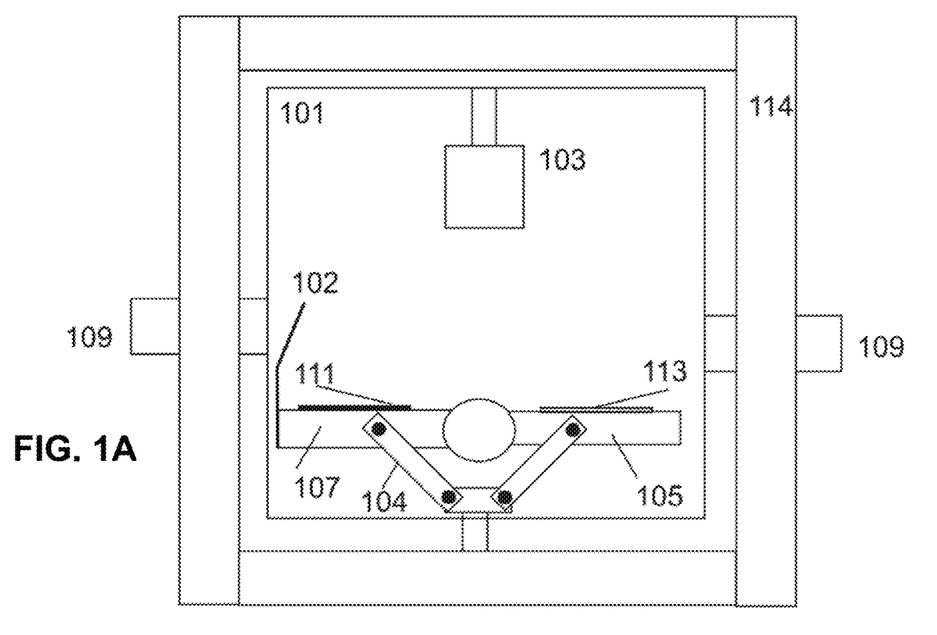
FIGS. 1A-1D show a plurality of schematics for a vacuum chamber design for wafer bonding with surface activation and related process steps for bonding of semiconductor, oxide, or metallic material in a UHV chamber, wherein a frame is structured around the UHV chamber to withstand high pressure or impact forces experienced during the bonding step, and also show a hinge element utilized to manipulate wafers inside an ultra-high vacuum chamber, in accordance with an embodiment of the invention.
Figure 1B:
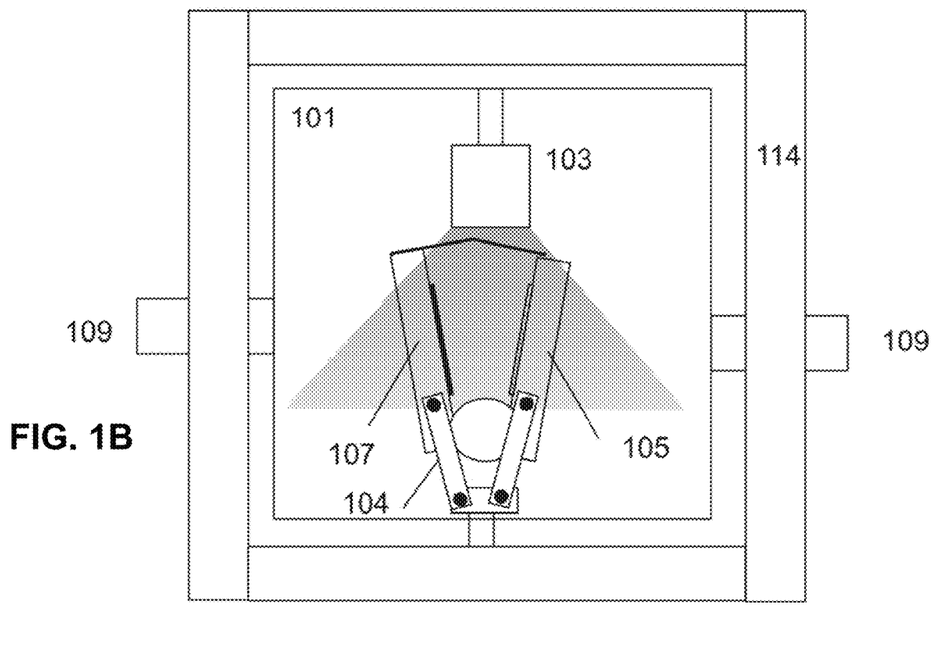
Figure 1C:
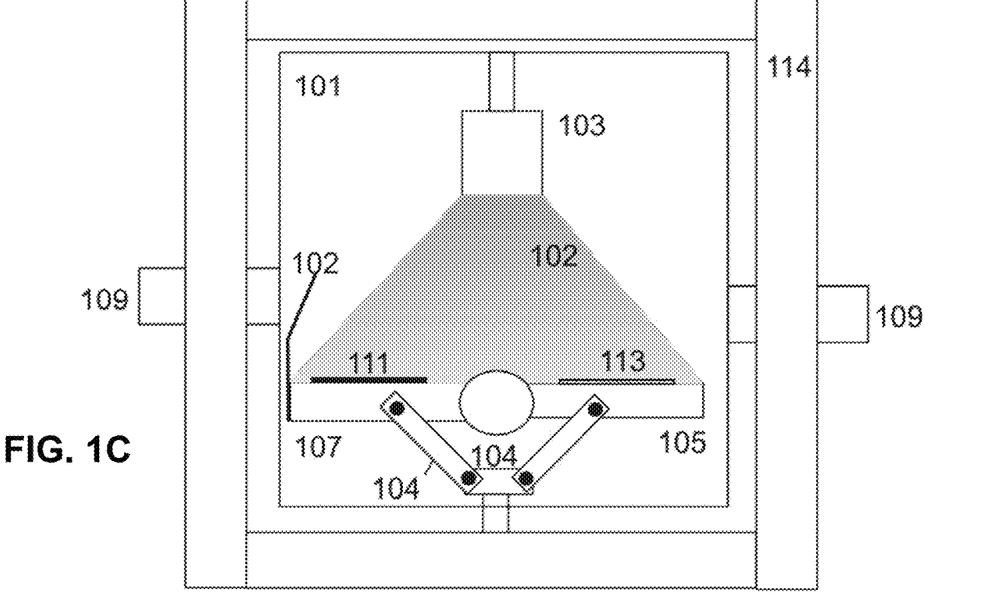
Figure 1D:
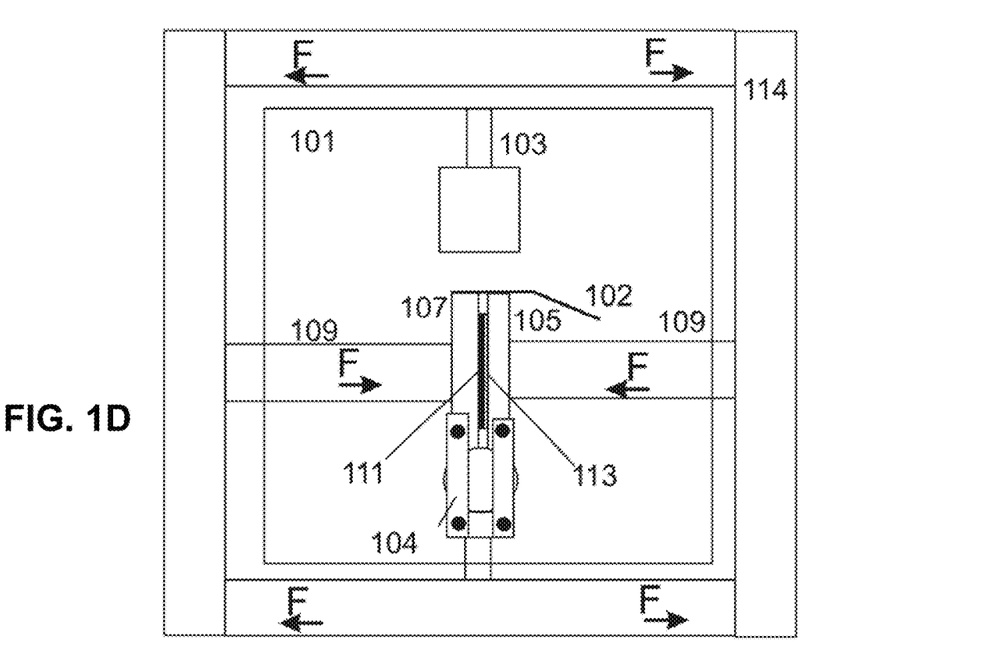
Figure 2A:
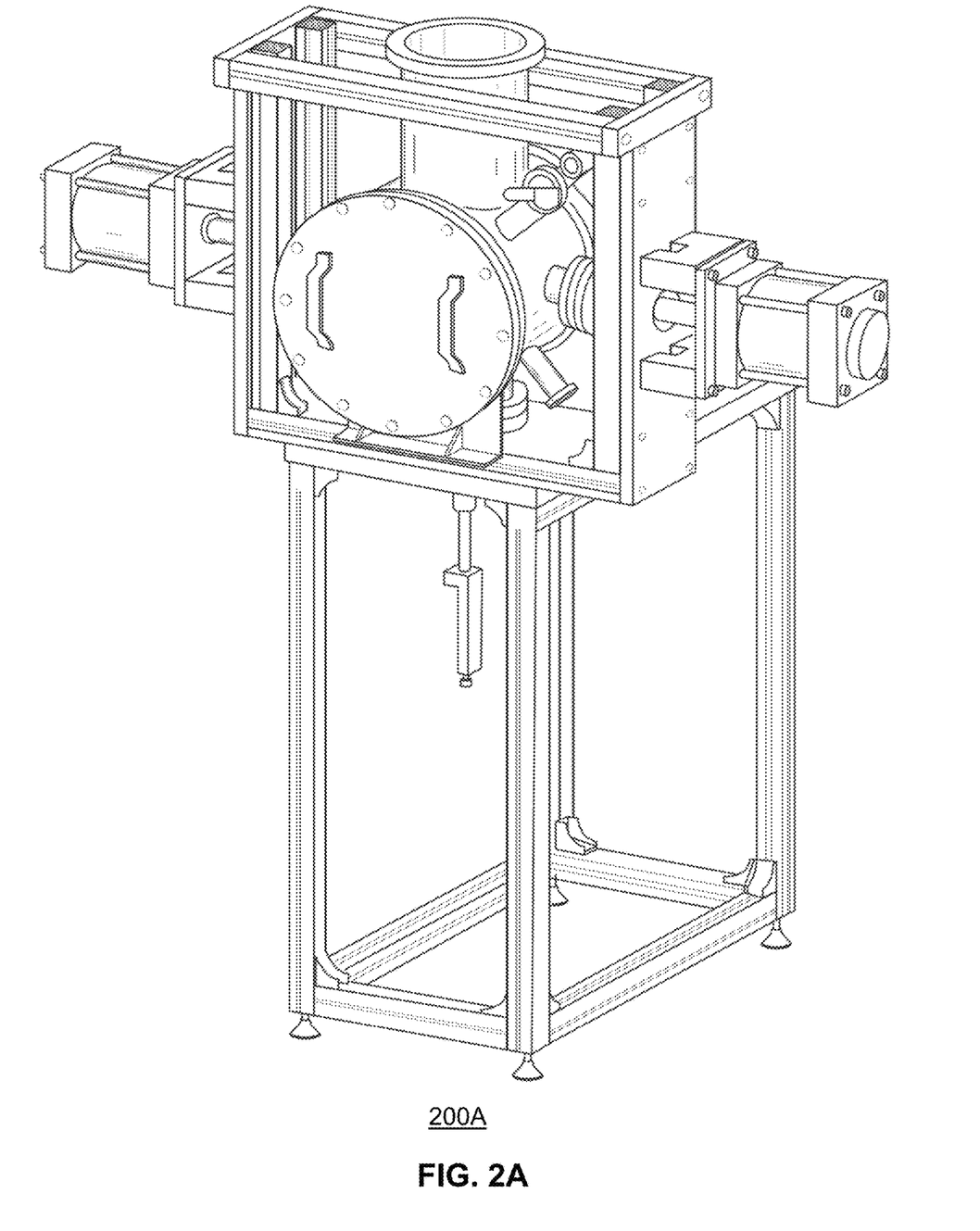
FIG. 2A and FIG. 2B show the overall and the cross section of the vacuum chamber for bonding of semiconductor, dielectric, or metallic wafers, in accordance with an embodiment of the invention.
Figure 2B:
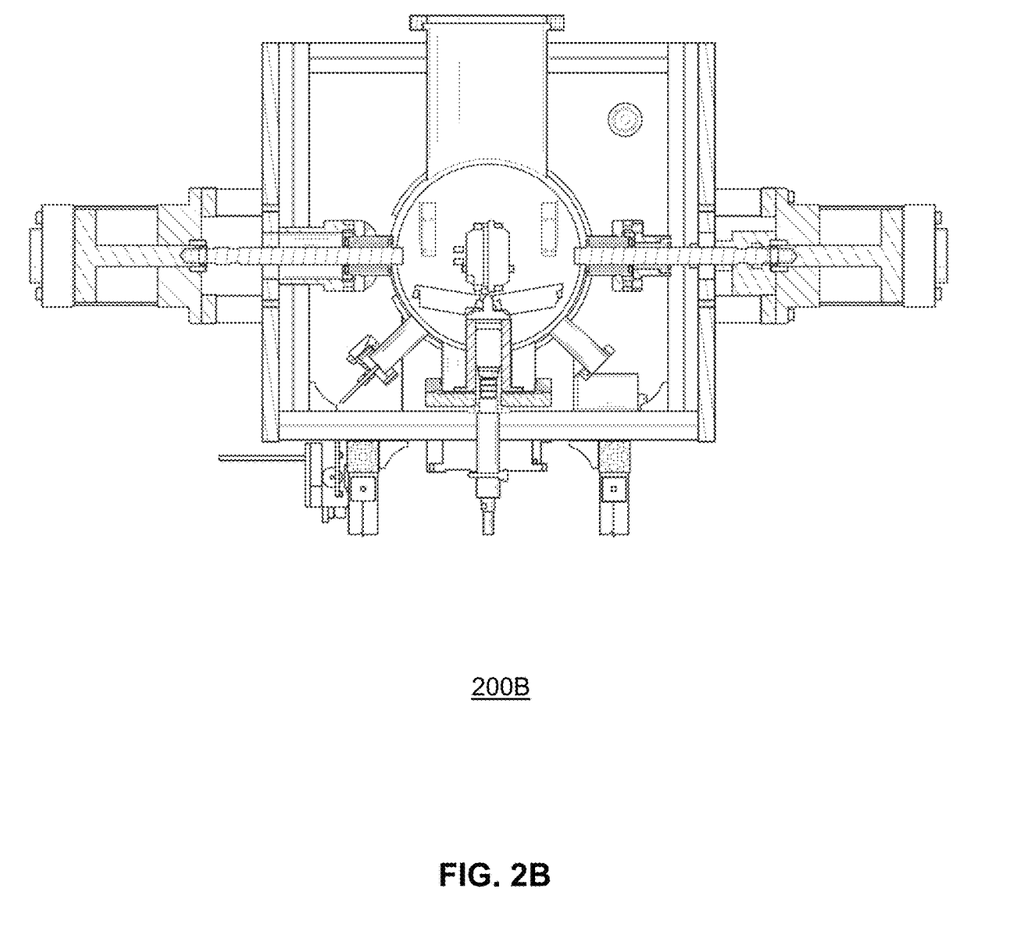

FIG. 2A shows a perspective diagram (200A) of the apparatus with the vacuum chamber for bonding of semiconductor, dielectric, or metallic wafers, while FIG. 2B shows a cross section (200B) of the vacuum chamber, in accordance with a preferred embodiment of the invention. Furthermore, FIGS. 1A-1D show a plurality of schematics for a vacuum chamber design for wafer bonding with surface activation and related process steps for bonding of semiconductor, oxide, or metallic material in a UHV chamber, wherein a frame is structured around the UHV chamber to withstand high pressure or impact forces experienced during the bonding step, and also show a hinge element utilized to manipulate wafers inside an ultra-high vacuum chamber, in accordance with an embodiment of the invention.

In one example, the novel apparatus for bonding of polished surfaces comprises the following elements:

1. A high vacuum chamber (101) (e.g. a UHV chamber) in FIGS. 1A-1D, where all the components of the novel apparatus are attached to this body.

2. A hinge element (104) in FIGS. 1A-1D controlled with a DC motor for position changes and guiding of wafers inside the chamber. The hinge element (104) is attached to a linear feed-through unit, and depending on the location of the shaft in the linear feed-through unit, the wafers are placed in different positions.

3. Two wafer chucks (105,107) placed on the hinge element (104) in FIGS. 1A-1D, which is utilized to guide and control the wafers inside the vacuum chamber. The chucks have two or several pins (FIG. 5) that are pushed out in normal condition by using a spring and are pushed in when the wafers are brought into contact for wafer bonding process.

4. A plasma source (103) in FIGS. 1A-1D placed above the chamber and configured to activate wafer surfaces.

5. Several shields (FIG. 6) and a shutter (e.g. 102 in FIG. 1A, FIG. 1C, FIG. 1D, FIG. 5) attached to one of the wafer chucks. The shields prevent deposition from the plasma source to chamber walls and sensitive instruments, while also creating a gettering medium where the contamination on the wafer surface is reduced after the pre-deposition process. The shield prevents the particles to reach the substrate during pre-deposition process step.

6. A bottom feedthrough configured to operate the hinge element and attached to a stepper motor, which is controlled by a PLC unit.

7. A frame (114) in FIGS. 1A-1D that encloses the UHV chamber with pneumatic or hydraulic actuation element (109), wherein the actuation elements place a force on the chucks inside the vacuum chamber, and wherein the frame is used to relive the reaction force for the bonding of the wafers. The frame is connected with two shafts and via a feedthrough to the wafer chuck using a bellow element. The actuation element is de-coupled from the high vacuum chamber.

8. Two feedthroughs configured to apply force on the wafers and two bellows that are utilized to roll in a shaft that is coupled to the frame assembly. The bellows allow the shaft to be moved into the chamber during the wafer bonding step while the high bonding force is transmitted through the shaft to the frame.

9. Two high-force bond actuation elements (i.e. 109) in FIGS. 1A-1D attached to the frame, which are used to push or pull the bonding shaft in and out of the vacuum chamber and are used to provide the bond actuation force.

10. A vacuum pump utilized to pump the system in combination with other pump(s).

11. One or more vacuum gauges utilized to monitor the pressure of chamber.

12. Electronic control units that operate the vacuum pump, pressure gauges, and the manipulators.

13. A DC or RF plasma source power supply unit.

According to this embodiment of the invention, the apparatus for wafer bonding achieves the process for the wafer bonding in by the following steps:

1. The wafer chucks are placed inside the hinge element and are held in place with spring loaded elements (i.e. 401, 403, 405 in FIG. 4). Two wafers (i.e. 111, 113 in FIG. 1A) that should be bonded are placed on the two wafer chucks in the unload position, as shown in FIG. 1A. The wafer chuck pins are pushed out with a spring element, as shown in FIG. 5, and hence they retain the wafer in position as shown in FIG. 1A.

2. The hinge element (104) is then partially closed to pre-deposition position, as shown in FIG. 1B, where the shutter that is attached on one wafer chuck (i.e. FIG. 5) prevents deposition of materials from the plasma source to the surface of the wafers.

3. The system is pumped down to low vacuum levels.

4. The plasma source is turned on for several seconds, as illustrated in FIG. 1B. During this process, either a metal layer is sputtered of the surface of the plasma source target and is deposited on the shutter, or if the plasma source is a ion source, the surface of the shield is bombard with ions.

5. The hinge element (104) is moved to the deposition position, as shown in FIG. 1C. The angle and the position are selected such that very uniform surface activation is achieved across the surface of the two wafers. The plasma source is turned on again and either a metal layer is deposited on the wafer surfaces for ADB method or native oxide layer of the wafer surface is removed for SAB method. In any case after this process dangling bonds are formed on the surface of the wafers.

6. The hinge element (104) is then moved to the bond position (FIG. 1D).

Figure 7:
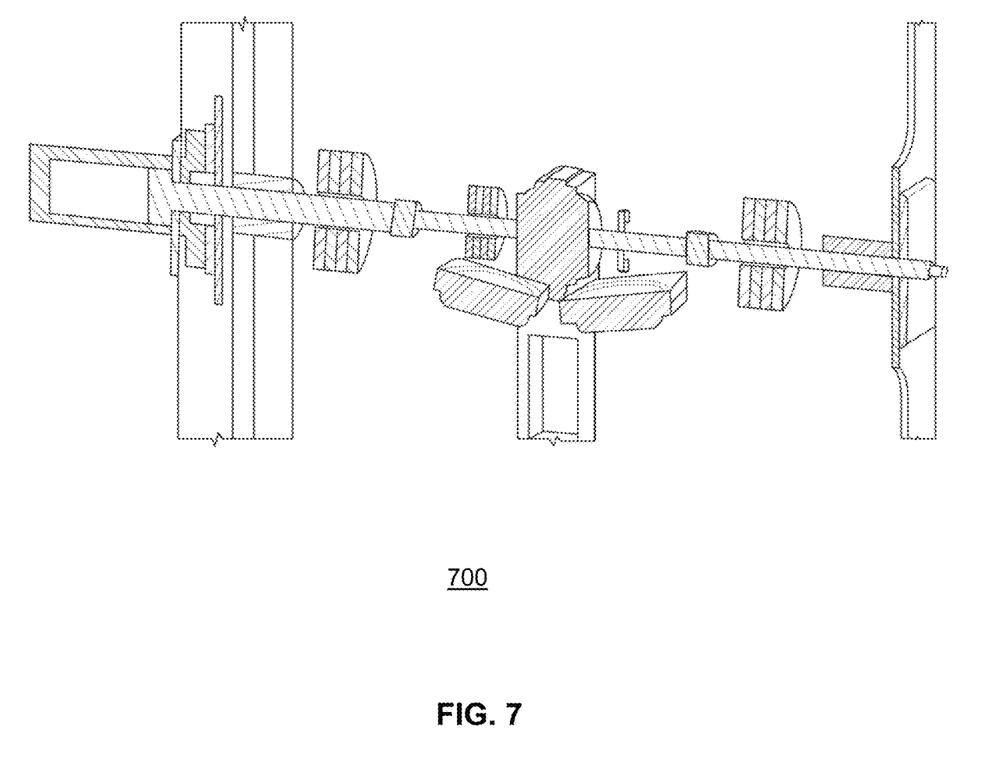
FIG. 7 shows a high-level view of a high-force actuation element that incorporates a frame around a UHV chamber to withstand the high forces exerted during the bonding step and the actuator is de-coupled from the vacuum chamber using bellows, in accordance with an embodiment of the invention.

7. The bond actuator element (109) is activated and two arms push the wafers together, as illustrated in FIG. 1D and FIG. 7, in the bond position with high forces. The high force of the bond actuators is relieved through the frame that act as a counter-force element for high bonding force needed. After this steps the wafers are bonded together.

8. The hinge element (104) is moved to load-unload position (i.e. FIG. 1A), and the bonded wafer pair is unloaded from the chamber.

Furthermore, in a preferred embodiment of the invention, the polished substrates may be up to 4" single side or double side polished semiconductor, dielectric, oxide single crystal or amorphous materials with a thickness as small as several microns to several millimeters. The ultra-high vacuum chamber may be made from aluminum or stainless steel and can reach a base vacuum pressure in the range of $10^{-9}$ torr to $10^{-6}$ torr. The sputtered material can be highly reactive metals such as chromium, tungsten, titanium or other materials such as aluminum.

The thickness of the deposited metal may be sub-mono layer to several hundred nanometers. The deposition method can be DC sputtering source for ADB method. Alternatively, the plasma source may be an ion source that bombard the wafer surfaces and removes native oxide layer for SAB bonding methods. During the bonding step the applied force may be in range that provide a pressure ranging from 0.1 Mpascal to 1000 Mpascal.

FIGS. 2A-2B show the overall design (200A) and the cross section (200B) of the bonding apparatus. FIG. 2A shows the vacuum chamber with pneumatic or hydraulic bond actuators, the frame, the ports for plasma activation source and ports for other element of the system. FIG. 2B shows the cross section (200B) of the chamber where in addition to the vacuum chamber, actuators, frames and ports, the hinge element, wafer chucks, bellows and high force actuation element details can be seen.

Figure 3A:
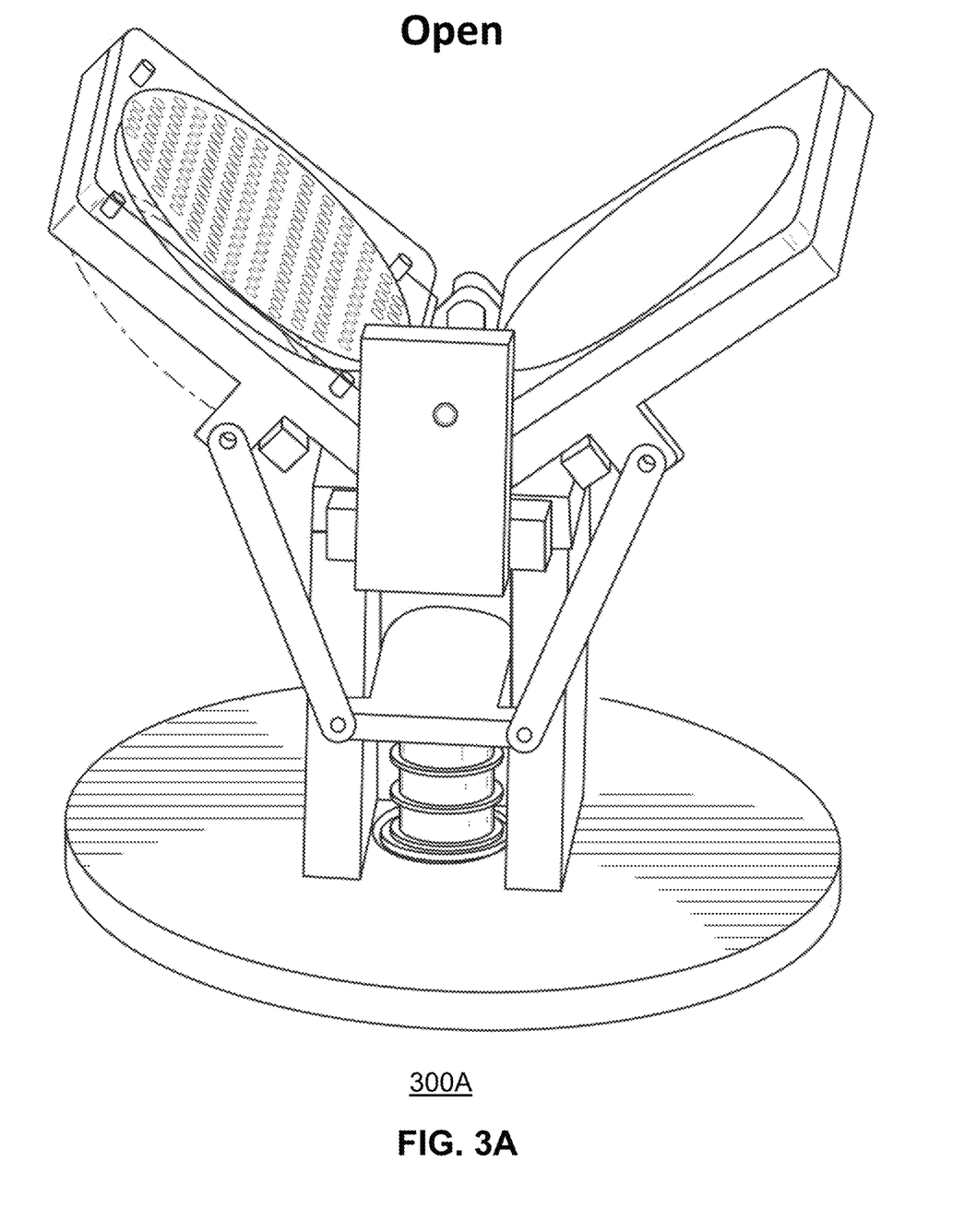
FIG. 3A and FIG. 3B show open and closed positions of a hinge element for bonding of substrates in a UHV chamber, in accordance with an embodiment of the invention.
Figure 3B:
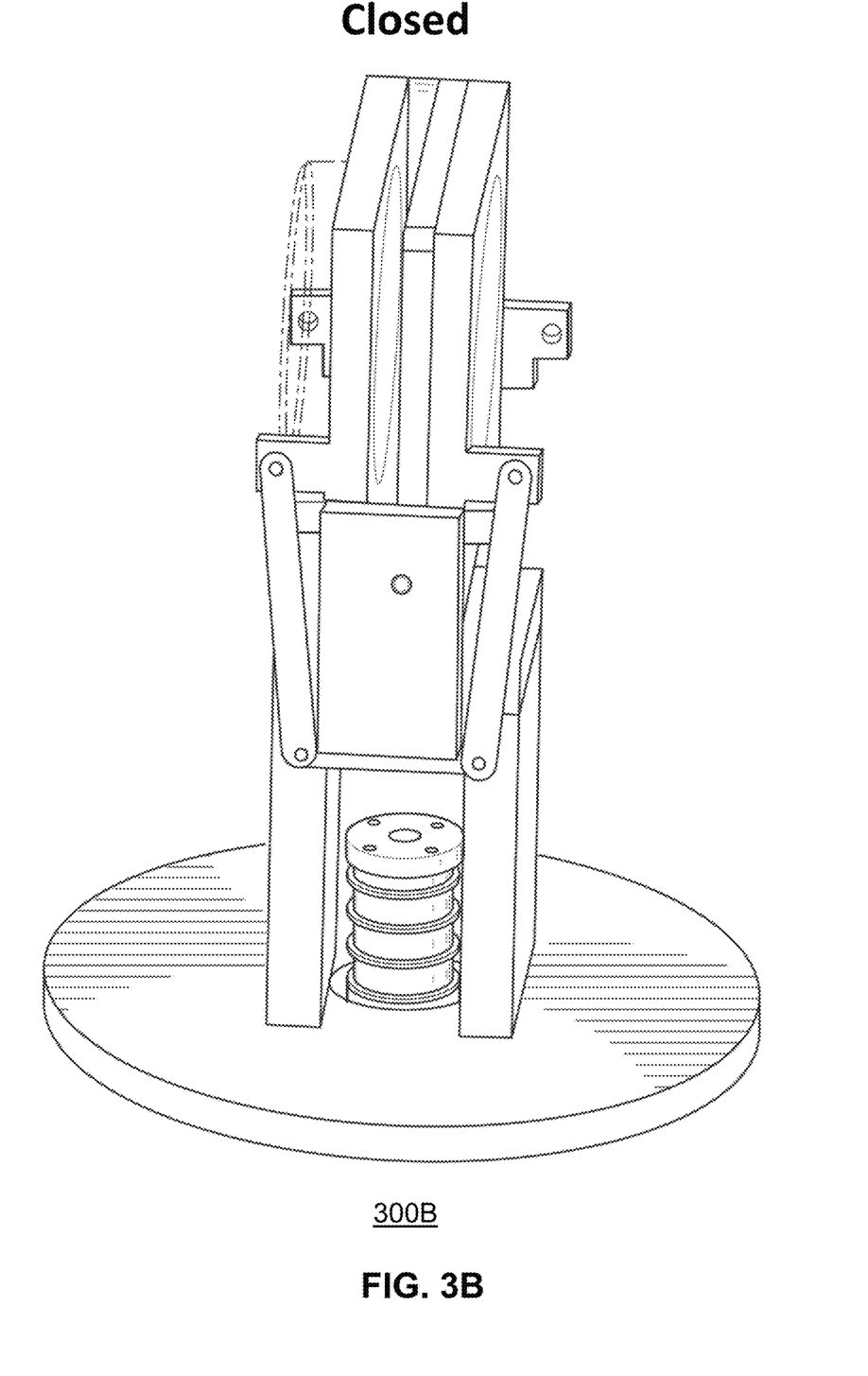

FIG. 3A shows the details of the hinge element of the bonding apparatus and the wafer chucks in an open position (300A), while FIG. 3B shows the details of the hinge element and the wafer chucks of the bonding apparatus in a closed position (300B). These illustrations show detailed exemplary connections of the wafer chucks, the stopping block to prevent the wafer chucks to get too close to each other, and the hinge element configured to mobilize and position the manipulate the wafer chucks.

Figure 4:
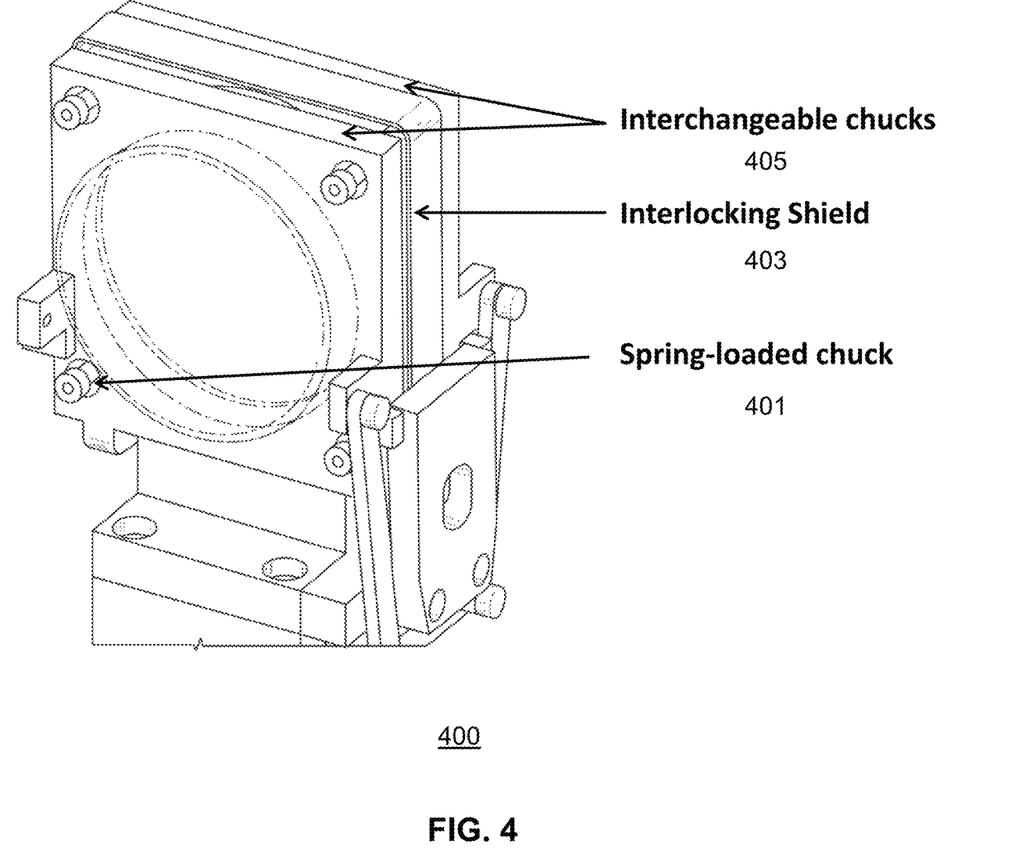
FIG. 4 shows a chucks holding element for the wafer bonding system that incorporates a spring loading element and a stopper element that are utilized in conjunction with interchangeable chucks, in accordance with an embodiment of the invention.
Figure 5:
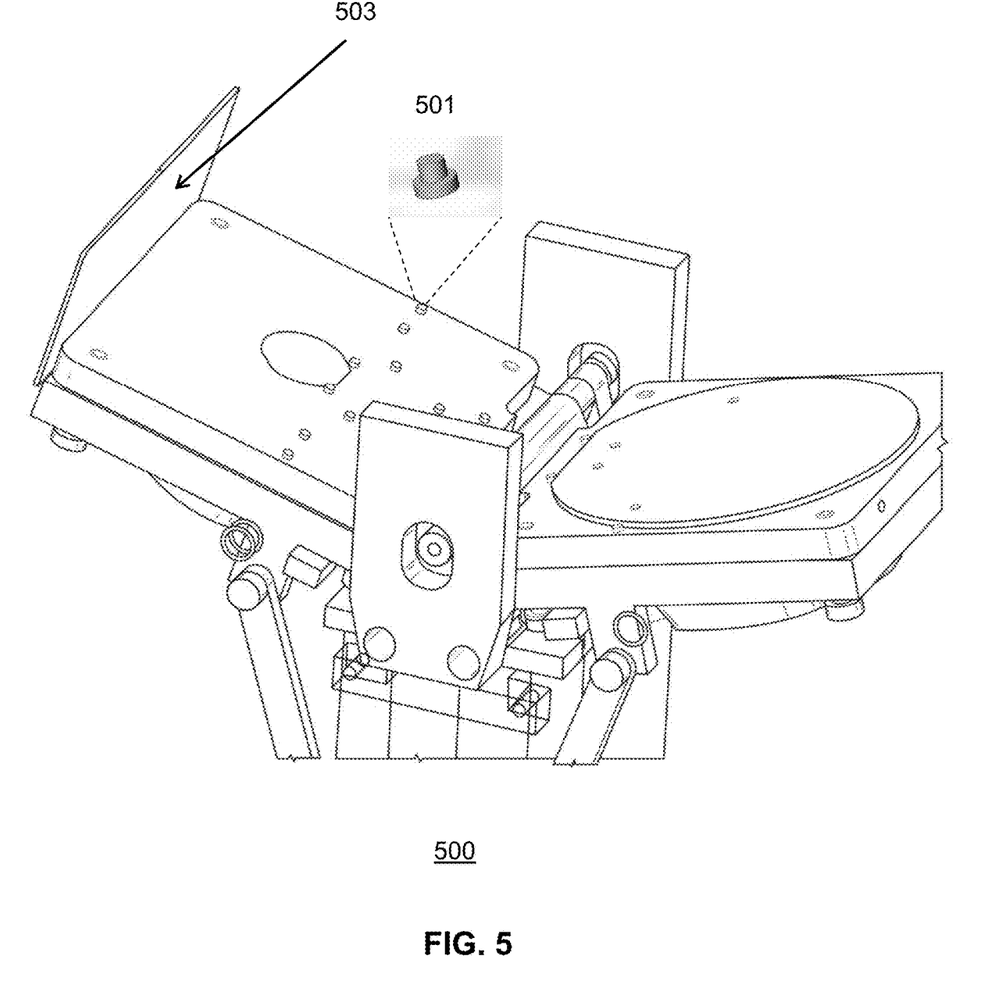
FIG. 5 shows the wafer retaining element in which a spring-loaded pin is used to hold the wafers and the pin is pushed back during a bonding step, wherein the wafer retaining element also incorporates a plate attached to the chuck that act as a shutter, in accordance with an embodiment of the invention.

FIG. 4 shows the spring loading element (400) of the bonding apparatus utilized to hold the chucks connected to the hinge element. In particular, this illustration shows a spring-loaded chuck (401), interchangeable chucks (405), and an interlocking shield (403) between the interchangeable chucks (405).

FIG. 5 shows the wafer-retaining element (500) of the bonding apparatus where spring-loaded pins (501) are used to hold the wafers on the two chucks. The spring-loaded pins (501) are pushed in as the chucks are raised to the bonding position during a bonding step. Additionally, the wafer-retaining element (500) also incorporates a plate (503) attached to the chuck that act as a shutter during the bonding step.

Figure 6:
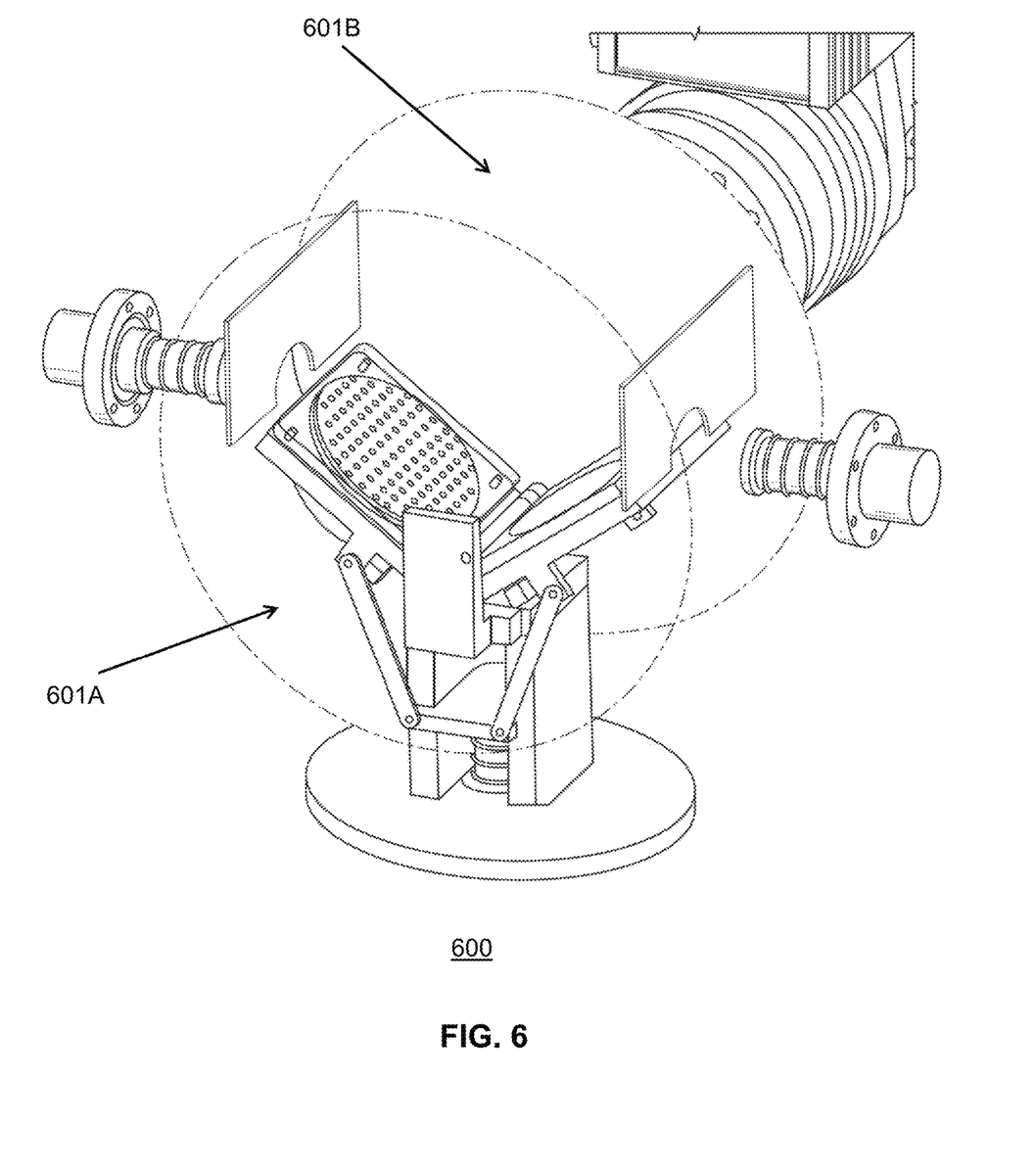
FIG. 6 shows a shielding element of the wafer bonding system, in accordance with an embodiment of the invention.

FIG. 6 shows one or more additional shields (601A, 601B) on the bonding apparatus (600). The additional shields (601A, 601B) configured to prevent the materials to be deposited on chamber walls during a pre-deposition process. At least in some cases, each shield (601A, 601B) also acts as a gettering media and absorb contaminations that exist in the chamber and allow higher-quality bonding to be achieved.

FIG. 7 shows a cross-sectional diagram (700) of a high-force actuation element in the bonding apparatus that incorporates a frame around a UHV chamber to withstand high forces exerted during the bonding step and an actuator which is de-coupled from vacuum chamber using bellows, in accordance with an embodiment of the invention. Since very high forces are needed during the bonding, the frame element allows the forces to be relieved and not excreted on the high vacuum chamber during the bonding step.

Figure 8A:
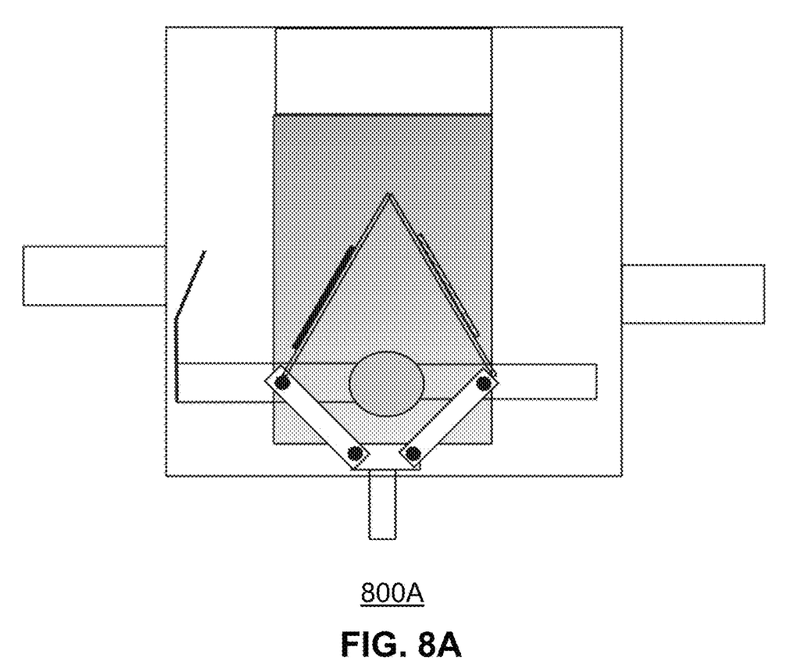
FIG. 8A shows a conceptual diagram of a chamber to bond wafers using SAB method where an ion gun is used, in accordance with an embodiment of the invention.

FIG. 8A shows a conceptual diagram (800A) of a chamber to bond wafers using SAB method where an ion gun is used, in accordance with an embodiment of the invention. In particular, this figure illustrates a system design for bonding based on SAB method. The plasma source in this design is an ion gun with a collimated ion sources. Because the ion beam is non-divergent and needs to cover the surface of wafers, the wafers are tilted upward. The ions hit the surface of the wafers at a glazing angle and remove a few mono-layers of oxide layers from one or more surfaces of the wafers. The wafers are then returned to horizontal position and bonded similar to what is shown in FIG. 1.

Figure 8B:
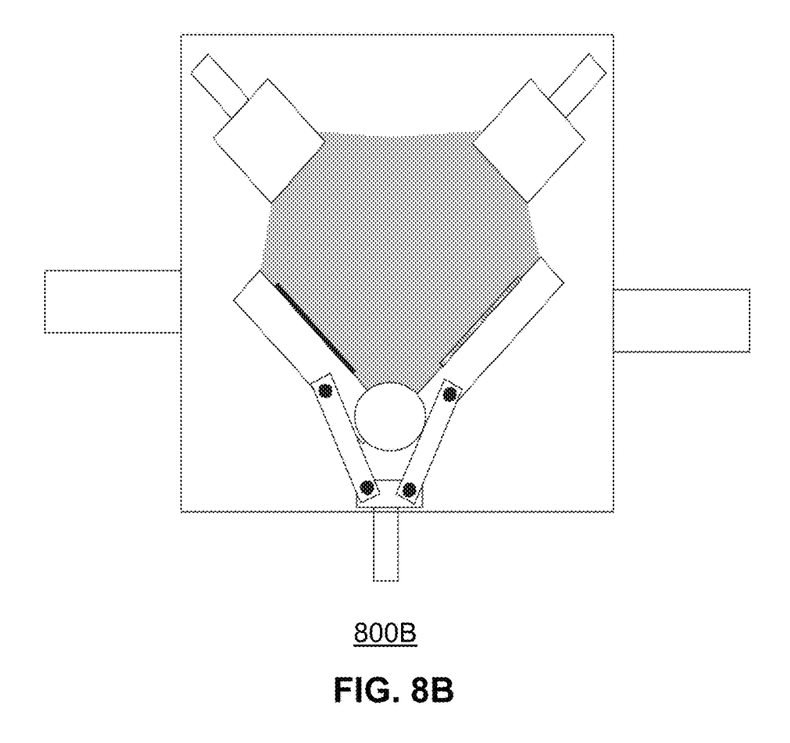
FIG. 8B shows a conceptual diagram of a chamber to bond larger-size wafers in which two plasma activation sources are used to activate wafer surfaces, in accordance with an embodiment of the invention.

FIG. 8B shows a conceptual diagram (800B) of a chamber to bond larger-size wafers in which two plasma activation sources are used to activate wafer surfaces, in accordance with an embodiment of the invention. This illustration shows an alternative design where two sputtering sources or two ion guns are used where the system can be used to bond materials with diameter exceeding 4" diameter for example 6" or 8" diameter wafers.

This particular embodiment discloses a few optical and electronic applications where the apparatus for bonding of wafers may be used to make these devices. In one embodiment of the invention, a method to fabricate a highly optically transparent thin film of single crystalline optical materials is disclosed. In this method the thin film is formed by bonding a single crystalline or amorphous material to a substrate using the wafer bonding method described. The resulting thin film has low optical absorption loss and can confine the light in the vertical direction. An optical circuit or an opto-electronic device will then be defined on this thin film using methods that are well-known to a person of ordinary skill in the art to make various integrated optical devices.

As previously illustrated and shown in FIGS. 1A-8B, in the preferred embodiment of the invention, the novel apparatus for bonding of two polished substrates includes a plasma source in a ultra-high vacuum (UHV) chamber and a wafer-guiding element to control and guide wafers in the UHV chamber, where after a plasma activation process the wafers are guided and pressed against each other to form a covalent bond between wafer surfaces. The plasma activation process involves deposition of mono-layer or submonolayer metallic atom on the surface of substrates. After deposition of metallic layers, a high-force actuation presses the wafers and forms a covalent bond between the wafers.

Then, the bonded wafer pair is ion-sliced or thinned to form single crystalline optical thin film. An annealing process oxidizes the deposited metallic layers and produces optically-transparent single crystalline thin film. An optical waveguide may be fabricated by this thin film while utilizing an electro-optic effect to produce optical modulators and other photonic devices. An optical cavity may be formed using the thin film of single crystalline optical material produced using the disclosed method where the single crystalline optical material is bonded on a distributed Bragg mirror (DBR) intermediate layer and a top DBR structure is deposited on the single crystalline thin film optical material. An optical cavity is produced where the light intensity can be switched using electro-optic effect by adjusting the refractive index of the single crystalline optical material and by applying a voltage to the device using two electrodes.

Figure 9A:
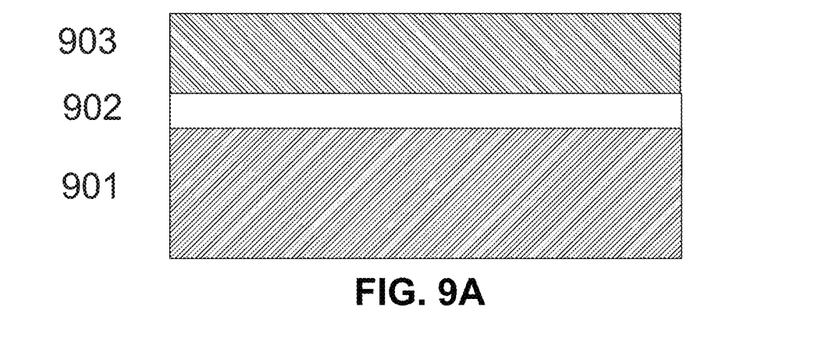
FIG. 9A and FIG. 9B show process steps for fabrication of optical waveguides using a novel wafer bonding apparatus, in accordance with an embodiment of the invention.
Figure 9B:
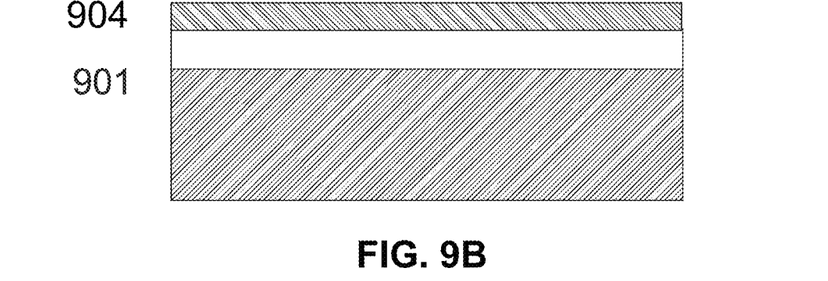

FIG. 9A and FIG. 9B show process steps for fabrication of optical waveguides using the novel wafer bonding apparatus described previously in association with FIGS. 1A-8B, in accordance with an embodiment of the invention. According to this embodiment, the process steps for producing a thin film by utilizing the novel wafer bonding apparatus are shown in FIG. 9A-9B. In one example, the method comprises the following steps:

1. Two smooth substrate surfaces (i.e. 901, 903) are produced by polishing or polishing followed by a high temperature annealing step.

2. Metallic layer(s) are deposited on the smoothed surfaces of a core substrate (903) and a handle substrate (901), typically with a plasma source. In some cases, an intermediate layer (902) is formed using nanocrystalline metallic atoms. Then, using the specialized wafer bonding apparatus previously described, the core substrate (903) with the material for a thin film layer is bonded to the handle substrate (901). A bond is formed based on atomic diffusion bond process.

3. The core substrate (903), which is now attached to the handle substrate (901), is then thinned down to several hundred nanometers to several microns using grinding or lapping methods as shown in FIG. 9B. After this step, a thin film (904) made of the core substrate material is formed.

4. At the final stage, a slab waveguide is annealed at high temperature of more than 400 degrees. During this process, the metallic adhesion layer for bonding is diffused into the core substrate (903) or to the handle substrate (901), and a low optical loss thin film (i.e. 904) made of the core substrate material is achieved.

According to this embodiment of the invention, the method for production of slab waveguide allows to achieve low-loss optical thin films by bonding materials with different CTEs by annealing at high temperatures after the bonded substrate pairs are thinned down to several microns.

The final product of the manufacturing process is a thin film of a single crystalline material as the core layer and a single crystalline or amorphous material as the cladding layer.

In addition, the structure resulting from the novel method of manufacturing the slab waveguide, in accordance with an embodiment of the invention, achieves low-loss thin films. After the thin film is formed, several different methods may be used to make optical waveguides or other opto-electronic devices known to a person skilled in the art.

Figure 10A:
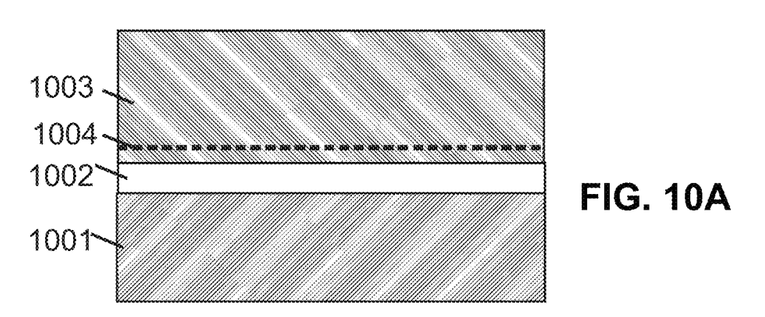
FIG. 10A-10C show alternate process steps for fabrication of optical waveguides using a novel wafer bonding apparatus, in accordance with an embodiment of the invention.
Figure 10B:
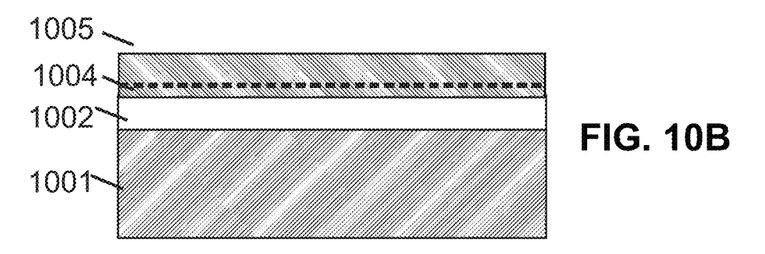
Figure 10C:
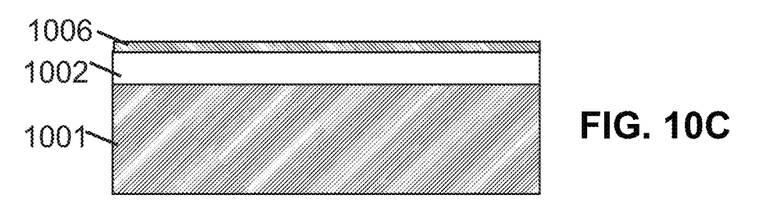

FIG. 10A-10C show alternate process steps for fabrication of optical waveguides using the novel wafer bonding apparatus described previously in association with FIGS. 1A-8B, in accordance with an embodiment of the invention. This alternative process steps for optical waveguide fabrication for making highly optically-transparent thin films of single crystalline materials are illustrated in FIGS. 10A-10C. The method comprises the following steps:

1. Two very smooth substrate surfaces (i.e. 1001, 1003) are produced by polishing or polishing followed by a high-temperature annealing step 2. A core substrate (1003) is ion-implanted with hydrogen or helium at a high dose. In a preferred example, the high dose is defined as a dose ranging from approximately $1e16/cm^2$ to $8e16/cm^2$. In another example, the high dose range may be higher or lower than the preferred example.

3. The core substrate (1003) is then bonded to a handle substrate (1001) using nanocrystalline metallic atoms. Consequently, a bond is formed based on atomic diffusion bond effect. The handle substrate (1001) may optionally include an intermediate layer (1002), as shown in FIGS. 10A-10C.

4. The core substrate (1003), which is attached to the composite substrate (i.e. 1001 and/or 1002) is then thinned down to several microns using grinding or lapping methods, as shown in FIG. 10B. After this thinning process, the core substrate's thickness is reduced to less than 50 microns, and becomes a thin film made of the core substrate material.

5. The resulting core substrate is then placed in an oven, and a thin layer of core material is sliced at the position of hydrogen or helium ion-implanted sites (1004). A final thin film (1006) made of the core material is formed after this process.

6. At this final stage of the waveguide fabrication, the thin film (1006) is annealed at high temperature, typically at more than 400 degrees. During this process, a metallic adhesion layer is diffused into the core layer or the cladding layer, and a optically highly-transparent thin film material is achieved. Optionally, the sample may undergo slight to moderate polishing to reduce the surface roughness of ion-sliced film at the final stage of the waveguide fabrication.

Moreover, in one embodiment of the invention, the core substrate may be lithium tantalate, lithium niobite, or other electro-optic crystals. The initial thickness of the core substrate (i.e. 903 or 1003) may be between 100 microns to one millimeter. The handle substrate may be quartz material that forms the cladding layer of a waveguide, a silicon substrate with silicon dioxide intermediate layer grown on its surface that forms the cladding layer for the slab waveguide, or another silicon substrate with other intermediate layers, such as Bragg grating or with no intermediate layer. Other intermediate layers may be formed by deposition methods.

In one embodiment of the invention, the thickness of the handle substrate may be 100 microns to several millimeters. Furthermore, the thickness of intermediate layer may be 100 nm to 20 microns, depending on the applications. A typical thickness is 1 micron. The intermediate layer may be grown or deposited on the substrate. The conductivity of silicon handle substrate might be very small (less than 0.0001 ohm-cm) or very large (more than 5000 ohm-cm) depending on the applications. A smoothening process may be used to reduce the surface roughness of the substrates prior to bonding step.

In one example, the surface roughness of the substrates may be 5 angstrom to 0.1 angstrom after smoothening process and prior to bonding. An annealing process may be applied to achieve smoothening of the surface of the substrates. The bonding process may deposit a mono-layer or sub-monolayer or several layers of metallic atoms on the substrate. The bonding pressure may vary between 0.1 Megapascal (MPa) to 1000 Megapascal (MPa), depending on the type of surface utilized for bonding. The thickness of a thinned core or an ion-sliced substrate after the thinning process may be 0.1 microns to 10 microns. A typical thickness is 300 nm. The annealing temperature for slab waveguide may be 500 degrees to 700 degrees. A typical annealing temperature is 550 degrees centigrade for a duration of 48 hours.

While the invention has been described with respect to a limited number of embodiments, those skilled in the art, having benefit of this disclosure, will appreciate that other embodiments can be devised which do not depart from the scope of the invention as disclosed herein. Accordingly, the scope of the invention should be limited only by formalized claims that will be presented in a corresponding non-provisional application.

What is claimed is:

1. A method for producing an optically-transparent thin-film wafer, the method comprising steps of:
   smoothening a surface of a core substrate from a first wafer and a surface of a handle substrate from a second wafer, wherein the core substrate is made of a single crystalline material;
   depositing one or more thin metallic layers on at least one of the core substrate and the handle substrate with an optional intermediate layer;
   bonding the surface of the core substrate from the first wafer and the surface of the handle substrate from the second wafer to form a bonded pair, which is achieved by a bonding pressure provided by a wafer-bonding apparatus operating in a vacuum chamber to assist atomic diffusion bonding;
   crystal ion-slicing or thinning the core substrate bonded to the handle substrate to form a thin film made of the core substrate; and
   annealing the thin film at an elevated temperature to allow oxidation or diffusion of the one or more metallic layers into the core substrate or to the handle substrate, which consequently enhances optical transparency of the thin film.

2. The method of claim 1, wherein the single crystalline material is lithium niobite, lithium tantalate, or another electro-optic crystal.

3. The method of claim 1, wherein the one or more metallic layers deposited on the core substrate or the handle substrate are at least one of titanium, chromium, tantalum, nickel, niobium, aluminum, or another metallic layer with a thickness of one mono-layer, sub-mono layer, or several mono-layers.

4. The method of claim 1, wherein the optically-transparent thin-film wafer has a thickness between 50 nm to 5000 nm.

5. The method of claim 1, wherein the handle substrate is made from silicon or quartz.

6. The method of claim 1, wherein the intermediate layer is made of silicon dioxide with a thickness between 100 nm to 10 um.

7. The method of claim 1, wherein the intermediate layer is a distributed Bragg mirror structure.

* * * * *